(12) United States Patent
Sarkar et al.

(10) Patent No.: US 6,718,764 B1
(45) Date of Patent: Apr. 13, 2004

(54) SYSTEM AND METHOD FOR MICROSTRUCTURE POSITIONING USING METAL YIELDING

(75) Inventors: Niladri Sarkar, Brossard (CA); Aaron Geisberger, Plano, TX (US)

(73) Assignee: Zyvex Corporation, Richardson, TX (US)

(*) Notice: Subject to any disclaimer, the term of this patent is extended or adjusted under 35 U.S.C. 154(b) by 42 days.

(21) Appl. No.: 10/184,492

(22) Filed: Jun. 28, 2002

(51) Int. Cl.$^7$ ................................................ F01B 29/10
(52) U.S. Cl. ............................................ 60/527; 60/528
(58) Field of Search ........................... 60/527, 528, 529

(56) References Cited

U.S. PATENT DOCUMENTS

| | | | |
|---|---|---|---|
| 5,602,955 A | 2/1997 | Haake | |
| 5,692,086 A | 11/1997 | Beranek et al. | |
| 5,745,624 A | 4/1998 | Chan et al. | |
| 5,870,518 A | * 2/1999 | Haake et al. | 385/90 |
| 6,164,837 A | 12/2000 | Haake et al. | |
| 6,261,494 B1 | 7/2001 | Zavracky et al. | |
| 6,280,100 B1 | * 8/2001 | Haake | 385/73 |
| 6,302,593 B1 | * 10/2001 | Haake | 385/74 |
| 6,327,855 B1 | 12/2001 | Hill et al. | |
| 6,367,251 B1 | 4/2002 | Wood | |
| 6,407,478 B1 | * 6/2002 | Wood et al. | 310/307 |
| 6,438,954 B1 | * 8/2002 | Goetz et al. | 60/527 |

OTHER PUBLICATIONS

U.S. patent application Ser. No. 09/932,489, Ellis et al.

Zhang, Yanhang et al., "Stress Relaxation of Gold/Polysilicon Layered MEMS Microstructures Subjected to Thermal Loading," Proceedings of 2001 ASME IMECE 2001, pp. 1–8.

Zou, Jun et al., "Plastic Deformation Magnetic Assembly (PDMA) of 3D Microstructures: Technology Development and Application," Transducers '01, Eurosensors XV, 2001, 4 pages.

* cited by examiner

Primary Examiner—Hoang Nguyen
(74) Attorney, Agent, or Firm—Haynes and Boone, LLP

(57) ABSTRACT

A system and method of adjusting the power off positioning of a microactuator is disclosed. The microactuator has a first power off position and comprises a bimorph component. The bimorph comprises at least two materials, wherein the materials have different thermal expansion characteristics. When heated, the bimorph component of the microactuator bends due to asymmetric thermal expansion of the materials. If one of said materials is forced beyond a yield point, then when cooled, the actuator assumes a second power off position. The microactuator maintains the second power off position due to stress in the bimorph, which is induced by forcing the material beyond its yield point.

49 Claims, 6 Drawing Sheets

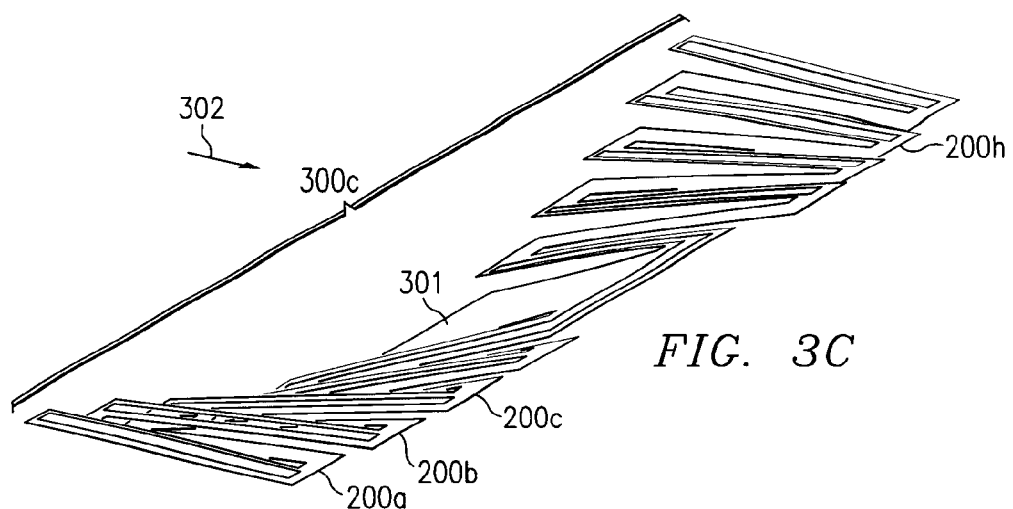
FIG. 3C
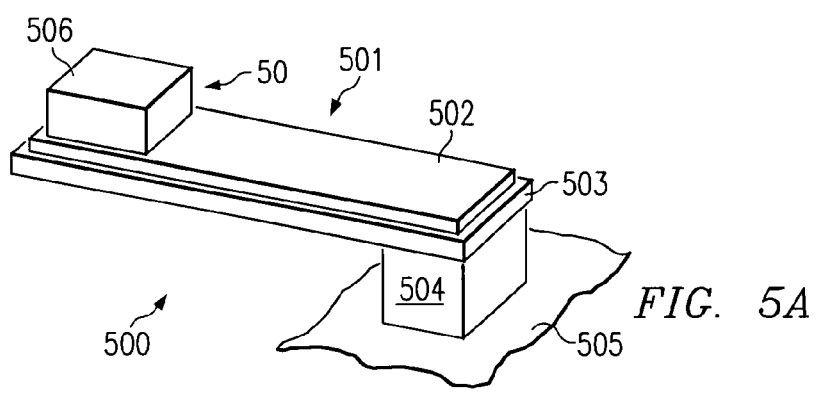
FIG. 5A
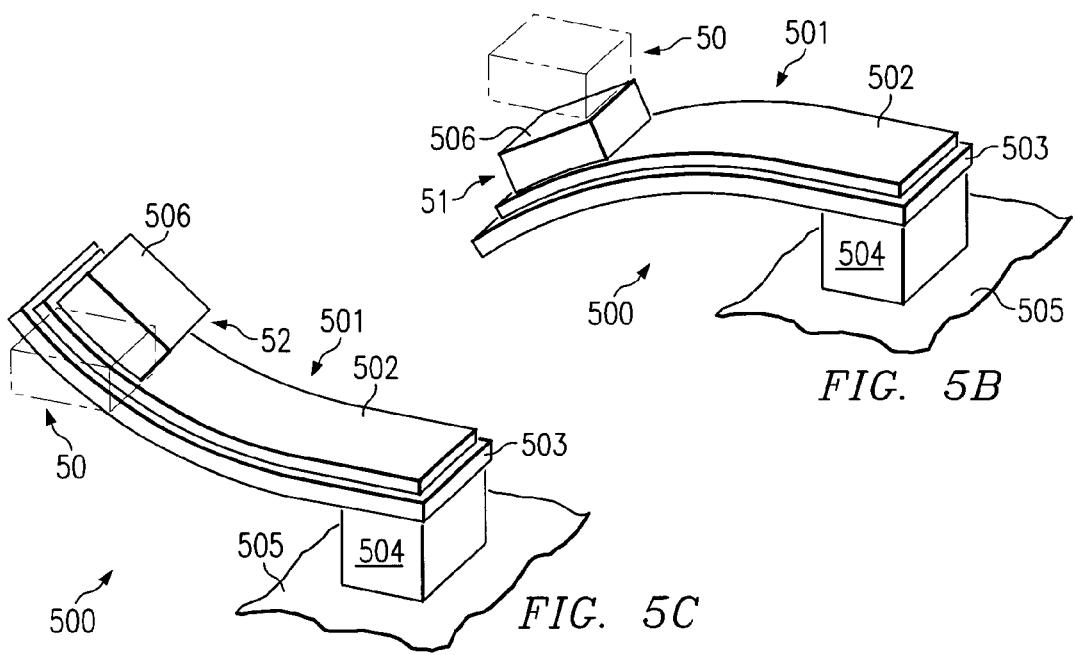
FIG. 5B
FIG. 5C

SYSTEM AND METHOD FOR MICROSTRUCTURE POSITIONING USING METAL YIELDING

TECHNICAL FIELD

This invention is related to positioning devices in microelectromechanical systems (MEMS) and, more particularly, to using a bimorph actuator that has been modified to affect the power off position of the positioning device.

BACKGROUND OF THE INVENTION

MicroElectroMechanical ("MEM") devices comprise integrated micromechanical and microelectronic devices. The term "microcomponent" will be used herein generically to encompass microelectronic components, micromechanical components, as well as MEMs components. The advances in microcomponent technology have resulted in an increasing number of microcomponent applications. Accordingly, a need often arises for precise positioning of microcomponent devices. For example, it is often desirable to position a microcomponent in alignment with a target position. For instance, for certain applications it may be desirable to align a microcomponent with another device. Because of the small size of microcomponents, they often require very precise positioning (e.g., precise alignment with another device). For example, in some cases a misalignment of only a few microns may be unacceptable. In fact, in some cases the size of the microcomponent being aligned may be only a few microns. Also, microcomponents present particular difficulty in handling and positioning operations.

Plastic deformation of single composition MEM devices is known. For example, U.S. Pat. No. 6,261,494, entitled METHOD OF FORMING PLASTICALLY DEFORMABLE MICROSTRUCTURES, the disclosure of which is incorporated herein by reference herein, teaches a method of plastically deforming MEM structures. Copending U.S. patent application Ser. No. 09/932,489, filed Aug. 17, 2001, and entitled SYSTEM AND METHOD FOR PRECISE POSITIONING OF MICROCOMPONENTS, the disclosure of which is hereby incorporated by reference herein, teaches deforming microactuators to fix the position of microcomponents.

Stress relaxation in bimorph microstructures is also known. For example, in the article entitled "Stress Relaxation of Gold/Polysilicon Layered MEMS Microstructures Subjected to Thermal Loading," by Zhang and Dunn, stress relaxation is studied for gold within a gold/polysilicon bimorph device. Creep may occur at elevated temperatures and may cause deformation if the bimorph is exposed to an elevated temperature over a period of time. Accordingly, yielding mechanisms in some materials are time and temperature dependent as well as stress dependent.

Microcomponents are commonly implemented in the field of optoelectronics. Generally, when coupling optoelectronic components, alignment is very important. That is, alignment of optoelectronic components is often critical for proper operation of an optoelectronic device. A relatively slight misalignment of optical components may drastically alter an optical device's performance. For example, accurate alignment of components is often important for ensuring proper propagation of an optical signal to/from/within an optoelectronic device. For instance, optoelectronic modules, such as optoelectronic receivers and optoelectronic transmitters commonly require proper alignment of microcomponents therein for proper operation. In general, proper alignment is desired to minimize the amount of attenuation within such optoelectronic devices.

One microcomponent that often requires proper alignment is an optical fiber. For example, in an optoelectronic receiver, a fiber is aligned with an optical detector, typically a PIN photodiode. Very large fibers may have light-guiding cores with a diameter of approximately 1 millimeter (mm) or 1000 microns ($\mu$m), but such fibers are rarely used in communications. Standard glass communication fibers have cladding diameter of 125 $\mu$m and light-guiding cores with diameter of approximately 8 to 62.6 $\mu$m. Proper alignment of the end of the optical fiber (which may be referred to as the "fiber pigtail") with the optical detector is important to ensure that a light signal is properly received by the optical detector. Similarly, in an optoelectronic transmitter, an optical fiber is aligned with a light source, such as a light-emitting diode (LED) or laser diode. Proper alignment of the end of the optical fiber with the light source is important to ensure that a light signal is properly communicated from the light source to the optical fiber.

The difficulty in achieving proper alignment of optical fiber is often increased because of variances in the size of fiber core diameters. For example, typical commercial graded-index fiber commonly specify a 50 $\mu$m nominal fiber core diameter that may vary within a tolerance of ±3 $\mu$m. Also, alignment/positioning of the light-guiding core within the sleeve of a fiber optic cable often varies (i.e., the core is not always centered within the sleeve), thereby further increasing the difficulty of properly designing a fiber with another optoelectronic device.

Various techniques have been developed for handling and positioning microcomponents, such as optical fibers. According to one technique, a high-precision, external robot is utilized to align microcomponents within devices. However, such external robots are generally very expensive. Additionally, external robots typically perform microcomponent alignment in a serial manner, thereby increasing the amount of time required for manufacturing microcomponent devices. That is, such robots typically perform alignment for one component at a time, thereby requiring a serial process for assembling microcomponents utilizing such a robot.

According to another technique, microactuators, such as electrothermal actuators, may be utilized to align microcomponents, such as optical fibers. For example, microactuators may be integrated within a device to align microcomponents within the device. Accordingly, use of such microactuators may avoid the cost of the above-described external robot. Also, if implemented within a device, the microactuators may enable parallel alignment of microcomponents. That is, multiple devices may have alignment operations performed by their respective microactuators in parallel, which may reduce the amount of time required in manufacturing the devices. Examples of techniques using microactuators integrated within a device to perform alignment of an optical fiber are disclosed in U.S. Pat. Nos. 6,164,837 and 5,602,955, the disclosures of which are hereby incorporated by reference herein.

Once a desired position is obtained for a microcomponent (e.g., alignment with another device) using either of the above techniques, such microcomponent may have its position fixed in some manner such that it maintains the desired position. Various techniques have been developed for fixing the position of microcomponents. According to one technique, an epoxy may be used to fix the position of a microcomponent. In another technique a low melting point bonding material, such as solder, may be used to fix the position of a microcomponent. Exemplary techniques that use solder to fix the position of an optical fiber are disclosed in U.S. Pat. No. 6,164,837, U.S. Pat. No. 5,692,086, and U.S. Pat. No. 5,745,624, the disclosures of which are hereby incorporated by reference herein.

According to another technique, an "active" alignment device may be utilized to fix the position of a microcomponent. Such an alignment device is "active" in the sense that electrical power has to be maintained in order to fix the alignment of a microcomponent. For example, in certain implementations that use microactuators integrated within a device to perform alignment of microcomponents, power to such microactuators must be maintained in order to maintain (or fix) the position of the microcomponents being aligned.

Plastic deformation micro-assembly has been demonstrated using Plastic Deformation Magnetic Assembly (PDMA), such as in the article entitled "Plastic Deformation Magnetic Assembly (PDMA) of 3D Microstructures: Technology Development and Application," by J. Zou, J. Chen and C Liu. However, PDMA technology can only be deformed to one position (i.e. unidirectional) and cannot be adjusted after the assembly step. Also, it requires the use of an external magnetic field and magnetic materials in the actuator itself.

SUMMARY OF THE INVENTION

The present invention is directed to a system and method in which a bimorph is used in a microelectromechanical actuator to modify the power off positioning of the actuator. The bimorph is comprised of two materials that are bonded together, each material having a different thermal expansion coefficient so that they expand at different rates when the temperature is increased. The temperature may be increased by applying a current to the bimorph or by applying an external heat source, such as a laser, to the bimorph.

As the bimorph is heated, the materials expand at different rates, thereby causing the bimorph to bend. Normally, when the heat source is removed, the bimorph will return to its original state. However, when the bimorph is heated such that the stress in one of the materials increases beyond the yield point, the bimorph is plastically deformed so that it does not return to its initial state after the heat source is removed. Instead, because of residual stress that is present in the material that was plastically deformed, when the heat source is removed, the bimorph is forced to bend in a direction opposite to the bending due to expansion. Typically, the material that has a higher thermal expansion coefficient will reach its yield point first and, therefore, will be plastically deformed.

As a result of the residual stress in the plastically deformed material, the bimorph assumes a new initial state. When the bimorph forms part of a microelectromechanical actuator, the microactuator assumes a new initial or power off state. Additionally, although the power off state of the microactuator may be modified from an initial position using the method of the present invention, the microactuator can still be moved by heating and thermal expansion.

The present invention has application in many areas, such as the telecommunications and fiber areas discussed above. Other applications, such as in microwave circuits, are also possible. For example, the deformable structures disclosed herein may be used to place inductors at a 90 degree angle to the substrate. In other applications, the invention can be used to adjust the positioning of capacitive plates.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present invention, reference is now made to the following descriptions taken in conjunction with the accompanying drawings, in which:

FIG. 3C is the rotary actuator of FIG. 3A in a modified initial configuration after being plastically deformed;

FIG. 5A is an alternative embodiment of a microactuator according to one embodiment of the invention;

FIG. 5B is the microactuator of FIG. 4A when power is applied to the microactuator;

FIG. 5C illustrates a new power off configuration of the microactuator of FIG. 4A after the microactuator has been pushed beyond a yield point.

DETAILED DESCRIPTION

Figure 1A:
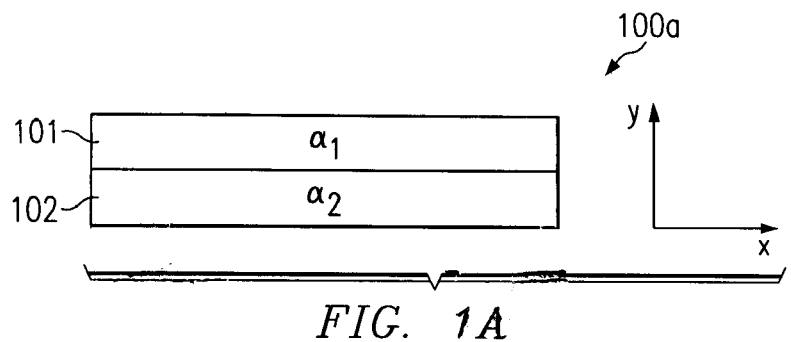
FIG. 1A is an exemplary bimorph of the present invention in an initial state.

FIG. 1A is an exemplary bimorph 100a that is constructed of two materials 101, 102 that are bonded together. The materials may be bonded together using any appropriate method or process. Each material, 101 and 102, has a respective thermal expansion coefficient, $\alpha_1$ and $\alpha_2$. Preferably, the thermal expansion coefficients $\alpha_1$ and $\alpha_2$ are sufficiently different so that materials 101 and 102 expand at different rates. In the embodiment illustrated herein, $\alpha_1$ is greater than $\alpha_2$ (i.e. $\alpha_1 > \alpha_2$) so that material 101 expands at a faster rate than material 102 when both are exposed to the same temperature increase. FIG. 1A represents an initial configuration of bimorph 100*a* at an initial temperature, such as room temperature or an expected operating temperature. Bimorph 100*a* is initially oriented so that it is essentially parallel to the x axis of FIG. 1A.

Figure 1B:
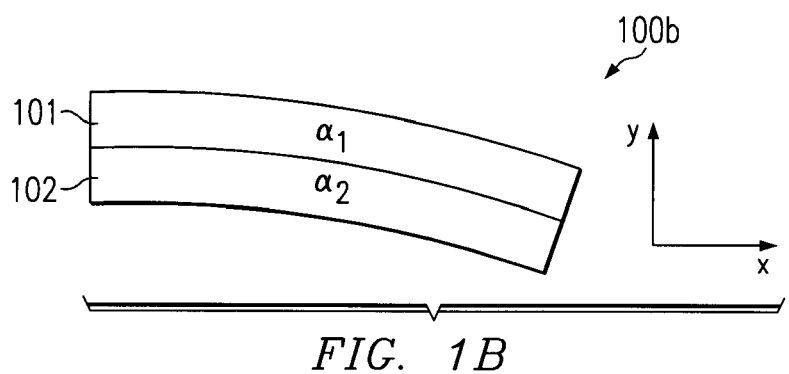
FIG. 1B is the bimorph of FIG. 1A in a state of elevated temperature.

FIG. 1B illustrates changes to bimorph 100*a* under elevated temperature conditions. Bimorph 100*a*, after being heated, is forced to bend in the direction of the negative y axis due to the higher thermal expansion coefficient, $\alpha_1$, of material 101. As materials 101 and 102 are heated, each material attempts to expand linearly along the x axis. Top material 101 expands at a faster rate and, therefore, to a longer length than material 102 due to its higher thermal expansion coefficient. As a result, as illustrated in FIG. 1B, bimorph 100*b* bends or deforms downward in the negative y axis direction.

The extent of the deformation depends upon the amount of heat applied to bimorph 100*b*. As more heat is applied, bimorph 100*b* bends further downward as material 101 expands further than material 102. Heating may be accomplished in any manner practical to the application. For example, material 101 and 102 may be heated by passing an electrical current through the bimorph or by applying an external heat source, such as laser energy, to the bimorph.

If the temperature is elevated high enough, the difference in thermal expansion coefficients between the two materials creates such a high stress in material 101 that it will actually yield. At the yield point material 101 will plastically deform on itself instead of moving bimorph 100*b* further.

Figure 1C:
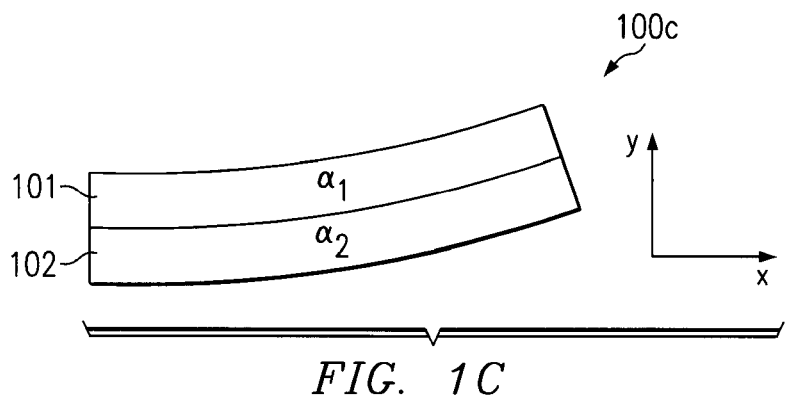
FIG. 1C is the bimorph of FIG. 1A after exposure to the elevated temperature of FIG. 1B.

FIG. 1C illustrates the configuration of bimorph 100*b* when it is cooled after being heated beyond the yield point of material 101. Thermal expansion deforms material 101 in FIG. 1B and then, as bimorph 100*b* cools down to the initial temperature, the bimorph moves to the position 100*c* illustrated in FIG. 1C. Bimorph 100*c* has been plastically deformed due to the elevated temperature in FIG. 1B. When the bimorph is cooled, materials 101 and 102 contract. Material 102 attempts to assume its original configuration as illustrated in FIG. 1A. However, because material 101 has been plastically deformed, materials 101 and 102 assume the shape of bimorph 100*c*.

Material 101 in FIG. 1C is still under stress due to being plastically deformed at the elevated temperature. Material 102, in FIG. 1C, is forced to bend due to the residual stress in material 101. As a result, the initial, power-off or at-rest condition of the bimorph has been changed from the original condition illustrated by bimorph 100*a* to the power off state 100*c*.

Figure 1D:
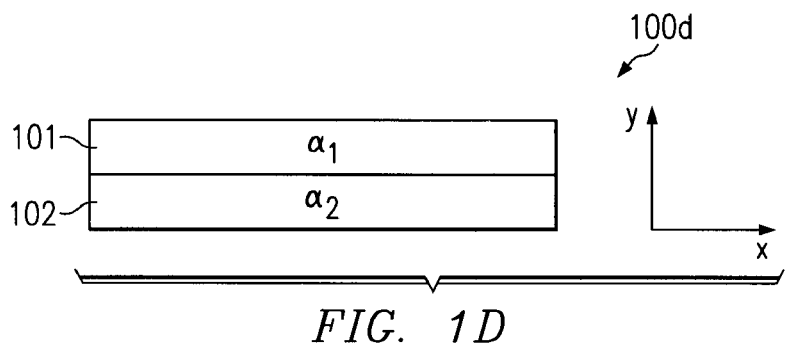
FIG. 1D is the bimorph of FIG. 1C at an elevated temperature state.

If bimorph 100*c* is heated, materials 101 and 102 will again expand and bimorph 100*c* will again bend downward due to the higher thermal expansion coefficient of material 101. In FIG. 1D, bimorph 100*d* represents the changes to bimorph 100*c* under elevated temperature conditions. Bimorph 100*d* has been heated and, in the exemplary illustration, expansion forces bimorph 100*d* to assume a substantially flat position that is similar to the initial condition of bimorph 100*a*. However, when the elevated temperature is removed, bimorph 100*d* will cool and return to the new initial condition illustrated by bimorph 100*c* in FIG. 1C.

Comparing FIGS. 1A and 1D, bimorphs 100*a* and 100*d* are in the same position, however, bimorph 100*d* must be heated to assume this position, while bimorph 100*a* is at an initial, non-elevated temperature. On the other hand, in FIGS. 1A and 1C, although bimorphs 100*a* and 100*c* are at the same initial temperature, bimorph 100*c* has assumed a new initial condition compared to the original positioning of bimorph 100*a* due to plastic deformation. These changes can be put to practical use in actuator or positioning elements in microelectromechanical (MEM) structures.

Using the method described above, a MEM actuator may be permanently plastically deformed to adjust its initial condition or position. Such adjustments may be performed iteratively to fine tune the initial positioning of the MEM structure. Materials 101 and 102 may be any plastically deformable material, such as nickel, gold, chrome, aluminum, metal, polysilicon or the like. The plastically deformable material, 101, 102, may be deposited by electroplating, etching or any other processes now known or later developed.

Figure 2B:
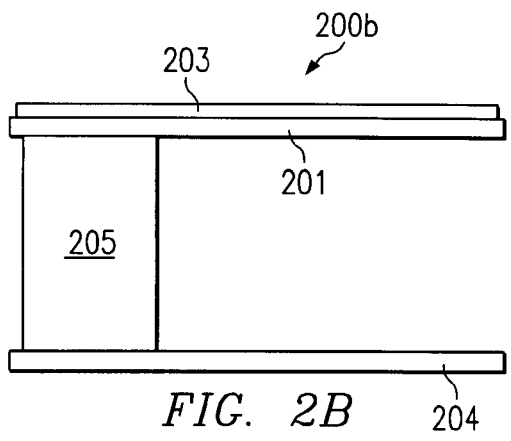
FIG. 2B is a side view of the bimorph actuator of FIG. 2A.
Figure 2A:
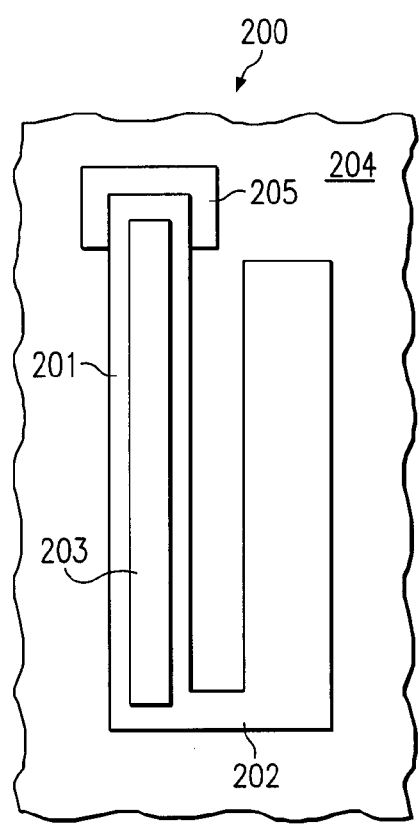
FIG. 2A is a top view of a bimorph actuator according to one embodiment of the present invention.

FIG. 2A is top view of MEM actuator 200 according to one embodiment of the invention. Actuator 200 is comprised of two coupled beams 201 and 202. In one embodiment, beams 201 and 202 may be constructed of monolithic polysilicon. Metal layer 203 is bonded to the top of beam 201. Metal layer 203 may be gold, nickel or any other suitable material that has a higher thermal expansion coefficient than the material used for beam 201.

FIG. 2B is a side view of MEM actuator 200 in an initial condition 200*b*, which is generally parallel to substrate 204. Actuator 200*b* is held above substrate 204 by material 205, which may be the same material as substrate 204 or beam 201, or may be constructed of some other material. FIG. 2B represents an initial condition of the actuator 200.

Figure 2C:
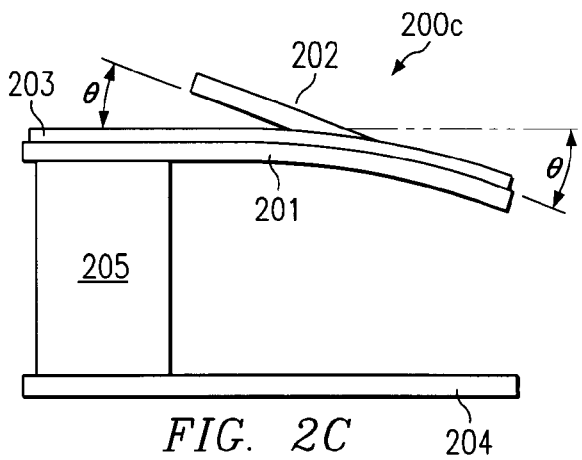
FIG. 2C is a side view of the bimorph actuator under elevated temperature conditions.

In FIG. 2C, actuator 200 has been heated, for example, by passing a current through beams 201, 202 and layer 203. As a result of heating, beams 201 and 202 have expanded. However, layer 203, which has a higher thermal expansion coefficient than beam 201, has expanded faster thereby forcing beam 201 to bend downward. Beam 201 is coupled to beam 202. Beam 202 consists of a single layer of material. Accordingly, beam 202 expands under increased temperature, but does not bend. However, because beam 202 is coupled to beam 201, beam 202 is forced to rotate upward by angle $\theta$, which corresponds to angle $\theta$ that beam 201 rotates downward due to the asymmetric expansion of layers 203 and 201.

Figure 2D:
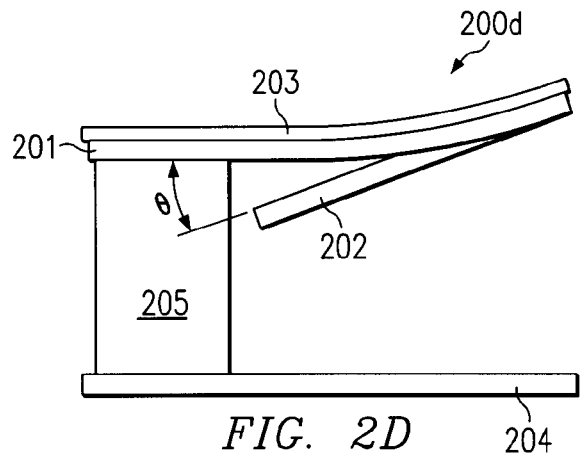
FIG. 2D is a side view of the bimorph actuator after it has been heated beyond its yield point in FIG. 2C.

Angle $\theta$ increases as the thermal heating and expansion of actuator 200 increases, until layer 203 reaches its yield point. If layer 203 has exceeded its yield point, then, when actuator 200 cools and contracts, actuator 200 will assume new initial configuration 200*d* illustrated in FIG. 2D. As discussed with respect to FIG. 1C above, the residual stress in material 203 forces beam 201 to bend at the initial temperature. As a result, in the new initial configuration, beam 202 is forced to rotate downward by angle $\phi$.

It will be understood that if actuator 200*d* is heated, then beam 201 and layer 203 will again expand asymmetrically, thereby forcing beam 202 to rotate upward from its new initial condition. In one embodiment, actuator 200*d* can be heated so that beam 202 rotates up to the original initial condition 200*b*. Actuator 200*b* represents the original power-off condition of the actuator and actuator 200*d* represents the modified power-off condition. As a result, after the modification discussed herein, actuator 200 will assume configuration 200*d* when no power or heat is applied to the system. However, if a system requires that actuator 200 be in configuration 200b, then heat or power must be applied to the system.

A series of actuators, such as actuator 200, may be linked together to form rotating and self erecting structures, such as those exemplary structures illustrated in FIGS. 3A–C and 4.

Figure 3A:
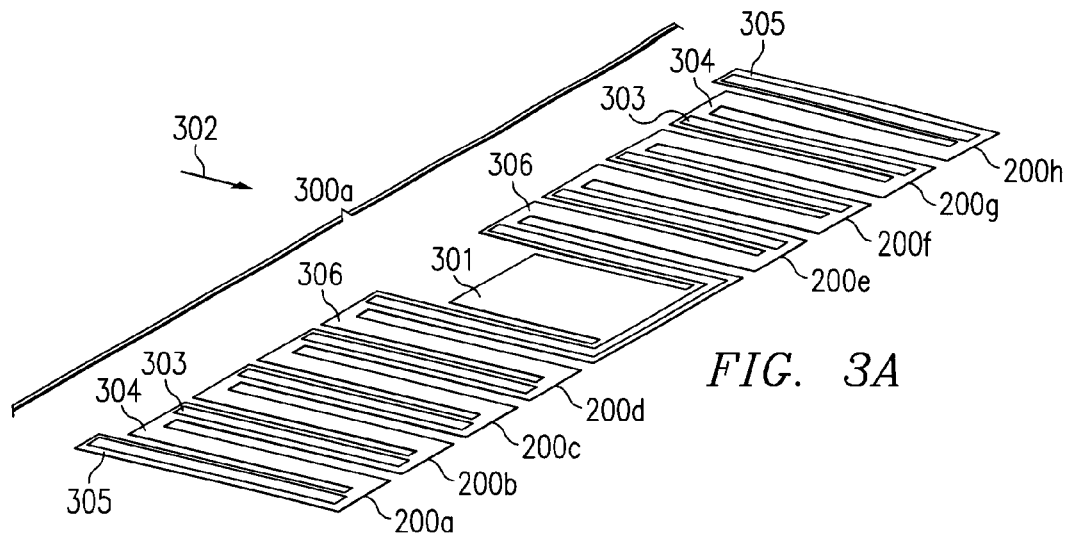
FIG. 3A is a rotary actuator according to one embodiment of the present invention.

For example, FIG. 3A is a rotary actuator 300 according to one embodiment of the present invention. Actuator 300 is comprised of a number of cascaded actuators 200 that are coupled to platform 301.

Figure 3B:
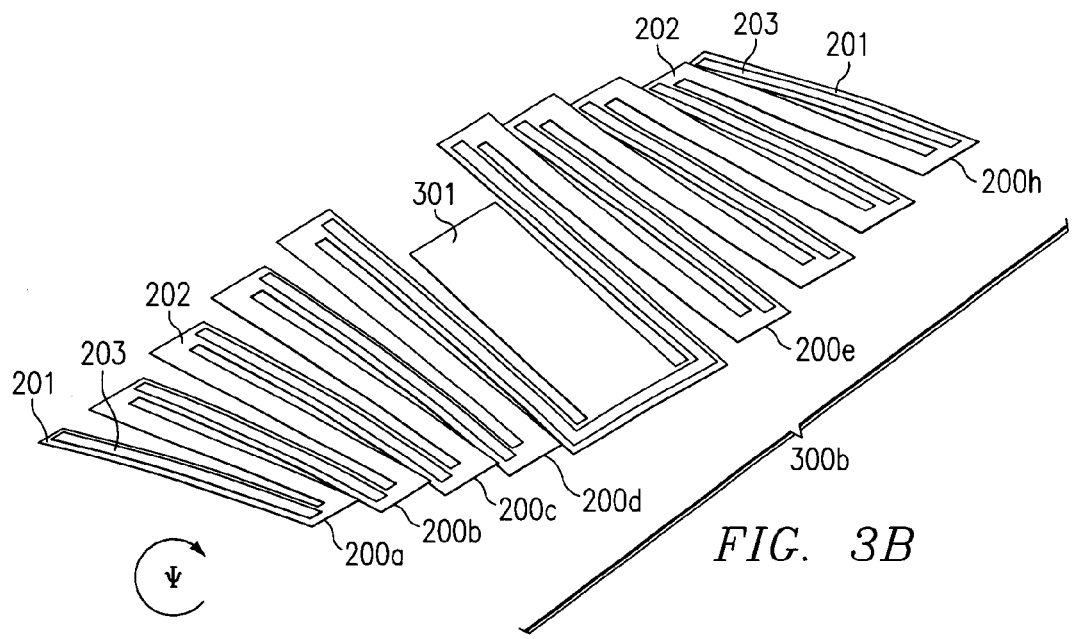
FIG. 3B is the rotary actuator of FIG. 3A with power applied so that the rotary actuator moves from an original configuration.

Rotary actuator 300 in FIG. 3A is in its initial power off condition. When power is applied to actuator 300, each individual bimorph actuator 200 activates and bends due to the asymmetric expansion of beams 201 and 202. Because a number of bimorph actuators 200 are linked together, the entire structure 300 is forced to rotate so that platform 301 is rotated from the horizontal plane into the vertical plane as illustrated in FIG. 3B.

If actuator 300 is heated sufficiently, layers 203 may exceed their yield point as discussed above. As a result, when power is removed and actuator 300 cools, it will not return to its initial state 300 shown in FIG. 3A, but will instead assume a new initial condition 300c illustrated in FIG. 3C. Accordingly, FIG. 3C represents the new power off position for rotary actuator 300. When power is applied, actuator 300 rotates to the new power on condition, which corresponds to FIG. 3A.

In one embodiment, actuator 300 as manufactured looks like FIG. 3A. Platform 301 may be a optoelectronic device, such as a mirror or sensor. A beam of light, oriented as illustrated by arrow 302, may pass across platform 301. When platform 301 is flat, as illustrated in FIG. 3A, the light beam passes platform 301 without interruption or detection. However, if platform 301 is elevated, as illustrated FIGS. 3B or 3C, then the beam of light is detected, blocked and/or reflected depending upon the type of device mounted on platform 301.

Depending upon the system, actuators having an initial condition as shown in FIG. 3A or 3C may be appropriate. If it is desired to have platform 301 in the path of light beam 302 as the default condition, then actuator 300c should be used. Because actuator 300c keeps platform 301 in the path of light beam 302 in the power off condition, it will use less energy. When power is applied to actuator 300c, it rotates to the position illustrated in FIG. 3A, thereby allowing light beam 302 to pass unimpeded and undetected.

However, if it is desired to allow light beam 302 to pass the actuator so that platform 301 is only occasionally placed in the path, then actuator 300a is desirable. Actuator 300a uses less energy when platform 301 is in a retracted position relative to light beam 302. When power is applied to actuator 300a, it rotates upward to the position illustrated in FIG. 3B, thereby allowing light beam 302 to hit platform 301.

One embodiment of the present invention is directed to a system and method in which cascaded linear bimorph actuators achieve large angle rotary displacements as illustrated in FIGS. 3A–C. Bimorph units contain substantially parallel pairs of beams, including a single material beam that remains straight when heated and a bilayer beam that deflects when heated, due to differential thermal expansion of the layers. In some embodiments, this concept is applied as part of a unit cell. For a bilayer beam, advantageous materials are gold on top of polysilicon. As the bilayer beam is heated, the metal expands more than the polysilicon, producing a deflection at the end of this beam. The angular deflection is amplified by mechanically cascading interconnected unit cells in a serpentine fashion. In some embodiments, successive beams are connected electrically in series to provide a continuous current path for resistive joule heating of the beams. This configuration achieves cumulative rotational displacements up to greater than 90 degrees. In some embodiments, the actuator is fully released and removed from the substrate to prevent mechanical interference against the substrate when actuated. In other embodiments, at least a segment of the substrate is removed from beneath the actuator to prevent interference. In further embodiments, the actuator is permanently anchored to the substrate.

In some embodiments, instead of having a physical axis of rotation intersecting part of the actuator, where it could actuate and interfere with the substrate, resulting in failure to rotate, the actuator can instead rotate away from the plane of the substrate about some virtual axis of rotation outside the actuator.

Embodiments of the present invention include single and plural-axis rotary motion with anchored and releasable geometries. Potential applications include rotary tweezers; Zero Insertion Force (ZIF) connectors with large contact surface areas; micro-mirror scanning, active optical alignment and beam steering, e.g., for telecom; large angle optical scanners; endoscopy and micro-surgery; MEMS manipulators; and any application in microsystems which requires large angle rotation about an axis.

The rotary actuator embodiment illustrated in FIGS. 3A–C comprises a plurality of cascaded coupled beams or actuators 200. Each of the beams 200 have first arm 303 and second arm 304. The cascaded beams may be disposed in a substantially planar folded serpentine array structure, as illustrated in FIG. 3A, such that first arm 303 of adjacent beam 200b is rigidly joined to second arm 304 of adjacent beam 200a in the serpentine array structure 300a.

The first arm 303 (or 203 of FIG. 2A) of each beam 200 is operable when activated to deflect or rotate in direction v out of the plane of the original planar folded serpentine array structure 300a. Second arm 304 of beams 200 is operable to remain undeflected when actuator 300a is activated. Initial beam 200a and final beam 200d in the serpentine array structure have terminal ends 305, 306, respectively, that are not joined with an adjacent beam.

The folded serpentine array structure 300a is operable when activated to rotate the final terminal end 306 relative to initial terminal end 305 through an angle of rotation substantially proportional to the sum of the deflections of all of said cascaded coupled beams 200a–d in the folded serpentine array structure 300a. The first arm 303 of beam 200b is a bimorph having an initial configuration that is relatively flat as illustrated in FIG. 3A. The configuration of first arm 303 is modified to a second configuration when arm 303 heated beyond a yield point of the materials 201, 203 comprising first arm 303.

Rotary actuator 300 of FIG. 3A may be rotated to any angle, such as ninety degrees or beyond, as long as a sufficient number of beams 200 are used in the array. Rotary actuator 300 is capable of erecting itself off of a substrate so that final terminal end 306 is lifted above the substrate. Final terminal end 306 may be coupled to payload region 301 so that when actuator 300 is operated, a payload on payload region 301 is rotated. Payload region 301 is supported by two serpentine array structures. The first array is comprised of beams 200a–d; and the second array is comprised of beams 200e–h. A payload such as microcomponents, mirrors, pick-and-place devices, rotary tweezers, mirrors, optical alignment means, beam steering devices, optical scanning devices, micro-surgical devices, microelectromechanical structure (MEMS) manipulation devices and the like may be placed on payload region 301.

Payload region 301 may also be a microinductor in an Radio Frequency (RF) circuit. The microinductor on payload region 301 may be rotated away from a lossy substrate to improve RF performance of the circuit.

Initial terminal end 305 may be attached to a substrate such as by permanent anchoring or flexible tethering. In an alternative embodiment, initial terminal end 305 may be releasably fastened to the substrate. Although beams 200 and arms 303 and 304 are shown as having substantially uniform length, it will be understood that beams 200 and arms 303 and 304 may have varying or staggered lengths in alternative embodiments.

Beams 200 may be thermally activated, for example, by using oven heating, laser heating, conductive heating, resistive joule heating and the like. Rotation of the actuator is caused by the bending of arms 303 due to differential expansion of a bimorph. The bimorph may be comprised of a metal and polysilicon. Beams 200a–h in the serpentine array structures may be connected electrically in series with one another to allow current to pass through the array facilitating electrothermal heating. The serpentine array structure 300a may be electrothermally activated by passing electric current in interwoven current paths through beams 200. In one embodiment, the electrical currents in the serpentine array structures are independently variable.

It will be understood that in alternative embodiments, beams 200 may be linked together in nonparallel formations thereby allowing for actuators to provide more complex movements upon activation.

Figure 4:
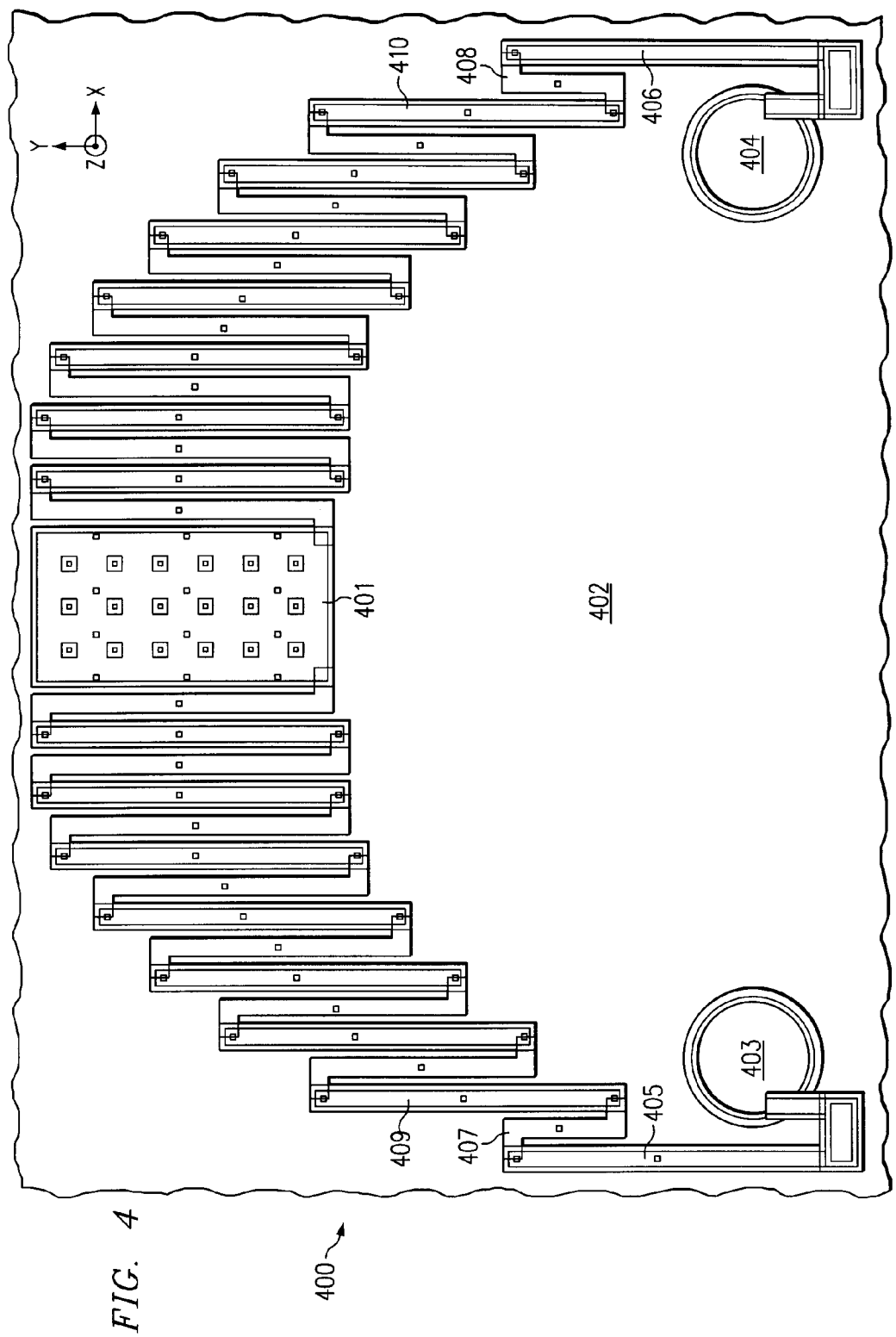
FIG. 4 is an exemplary deformable self-erecting structure that uses embodiments of the present invention.

FIG. 4 is a plan view depicting an alternative embodiment of the present invention, using substantially the same unit cell concept as in FIGS. 1A–2D. Structure 400 is a self-erecting structure that is, in one embodiment, substantially flat having all components substantially in one plane. When power is applied to self-erecting structure 400, the beams of the structure bend thereby causing payload area 401 to sink and/or rotate out of the initial plane toward substrate 402.

For clarity, coordinate axes X, Y, and Z are shown in FIG. 4, with the positive Z axis pointing out of the plane of the figure. Substrate 402 lies substantially parallel to the X-Y plane. Structure 400 is configured symmetrically in the X direction about a Y-Z mirror plane midway between electrical contact pads 403 and 404. Accordingly, all elements described in the left portion of FIG. 4 have mirrored counterpart elements with similar descriptions in the right portion of FIG. 4.

In operation, electric current is applied between contact pads 403 and 404 to heat structure 400. Bilayer beam 405 has two layers similar to bean 201/203 described above. In one embodiment, beam 405 is comprised of a monolithic polysilicon layer and a gold layer. When heated, beam 405 bends downward (i.e. toward substrate 402) and when heated enough the gold will plastically deform. As a result, when the power is removed, beam 405 assumes a new rest position that is deflected out of the initial plane and rotated in the positive Z axis (i.e. away from substrate 402). In a similar fashion, beam 406 can be deformed to a new initial position that mirrors beam 405.

Beams 407 and 408 are monolithic beams, such as monolithic polysilicon, that remain substantially straight when heated. Bilayer beam 405 is rigidly connected with single material beam 407 at their adjacent ends; and bilayer beam 406 is rigidly connected with single material beam 408 at their adjacent ends. To prevent structure 400 from mechanically interfering with substrate 402, beams 407 and 408 may be made shorter than bilayer beams 405 and 406.

Connected with the far end of beams 407 and 408 are longer bilayer beams 409 and 410 that, during operation (i.e. when heated), tend to bend toward substrate 402 in the same manner as beams 405 and 406. Connected with the far end of beams 409 and 410 are successive, alternating single layer and bilayer beams. Each successive bilayer beam rotates toward substrate 402 when heated and may be deformed to assume a new initial position that is rotated away from substrate 402 in a power-off state. The combination of the angular rotation and displacement of each successive set of beams causes payload area to rotate toward substrate 402 under power and to assume a deformed, at-rest position rotated away from substrate 402.

The structure of FIG. 4 is anchored to substrate 402 at contact pads 403, 404 and can accordingly self erect off of the substrate. Structure 400 can be deformed to assume an at-rest or power-off position wherein payload area 401 is rotated 90 degrees from the initial X-Y plane. Accordingly, in a new power-off position, payload area 401 may be substantially in the Z-X plane. Alternatively, the structure of FIG. 4 can be flexibly tethered either fully releasably or non-releasably to the substrate. A releasable design would typically have a relatively simpler actuation motion than that described in connection with FIG. 4.

In one embodiment, payload area 401 may be a capacitor plate and structure 400 may be positioned to vary the capacitance in a circuit. Alternatively, payload area 401 may be an inductor and structure 400 may be positioned to minimize loss created by coupling between the inductor and substrate 402.

It will be understood that, using the invention described herein, structure 400 may be heated so that it is rotated out of the X-Y plane to a point at which the stress in one or more of the materials in the bimorph units, such as 409 or 410, increases beyond the yield point. As a result, the bimorph unit will be plastically deformed and, when the heat is removed, the bimorph is forced to bend in the opposite direction as discussed herein. It is expected that a corresponding or mirrored bimorph unit, such as 409' or 410', will also deform so that structure 400 remains approximately symmetrical. In this exemplary embodiment, as a result of the deformation, structure 400 assumes a new initial or at-rest position in which it is rotated by some amount out of the X-Y plain in the negative Z direction around the X-axis.

FIGS. 5A–C illustrate another microactuator according to an alternate embodiment of the invention. In FIG. 5A, microactuator 500 has arm 501 that is a bimorph comprised of bonded materials 502 and 503. Preferably, material 502 has a higher thermal expansion coefficient than material 503. Arm 501 is mounted on post 504, which elevates the arm above substrate 505, thereby providing room for arm 501 to move. Microdevice 506 is mounted on arm 501. Microdevice 506 may be any device that may require small scale adjustments to its position in a system. For example, microdevice 506 may be an optoelectronic receiver or transmitter that must be positioned relative to a beam of light in an optical system.

Microactuator 500 in FIG. 5A is in an initial power off condition with microdevice 506 at first position 50. When power is applied to microactuator 500, such as when a current is applied to arm 501, materials 502 and 503 heat up and expand. Due to the difference in the materials' thermal expansion coefficients, arm 501 is forced to bend downward as material 502 expands faster than material 503. As a result, microdevice 506 is forced downward to new position 51 as illustrated in FIG. 5B. Microdevice 506 position 51 is offset below original position 50 (shown in outline in FIG. 5B).

It will be understood that if the power is maintained in the system, then microdevice 506 can be kept at position 51. If material 502 has not been pushed beyond its yield point and if the power is removed from microactuator 500, then, as microactuator 500 cools, it will return to the original position illustrated in FIG. 5A and microdevice 506 will return to original position 50.

However, if sufficient heat is applied to material 502 in FIG. 5B so that it is pushed beyond its yield point, then when power is removed and microactuator 500 cools, it will assume the new configuration illustrated in FIG. 5C. Residual stress in material 502 causes arm 501 to bend upward in a new power off configuration. In this modified power off configuration, microdevice 506 is in new position 52 that is above original position 50 (shown in outline in FIG. 5C).

Position 52 is the new power off position for microdevice 506 following the plastic deformation of material 502. As a result, microdevice 506 will remain in position 52 without requiring power or heat to be applied to microactuator 500. Using the adjustments illustrated in FIGS. 5A–C, the position of microdevice 506 can be finely adjusted within a system. For example, if microdevice 506 is an optoelectronic transmitter or receiver, its position may be adjusted for alignment with other optoelectronic devices. Because the power off position of the microactuator has been modified, the system will use less power to keep microdevice 506 in a desired position.

It will be understood that microdevice 506 may be moved from the new power off position 52 by again applying power or heat to microactuator 500. When power is applied, arm 501 is again forced downward due to the asymmetrical expansion of materials 502 and 503. As a result, microdevice 506 may be moved from position 52 to position 50 or 51 in a power on state.

Figure 6:
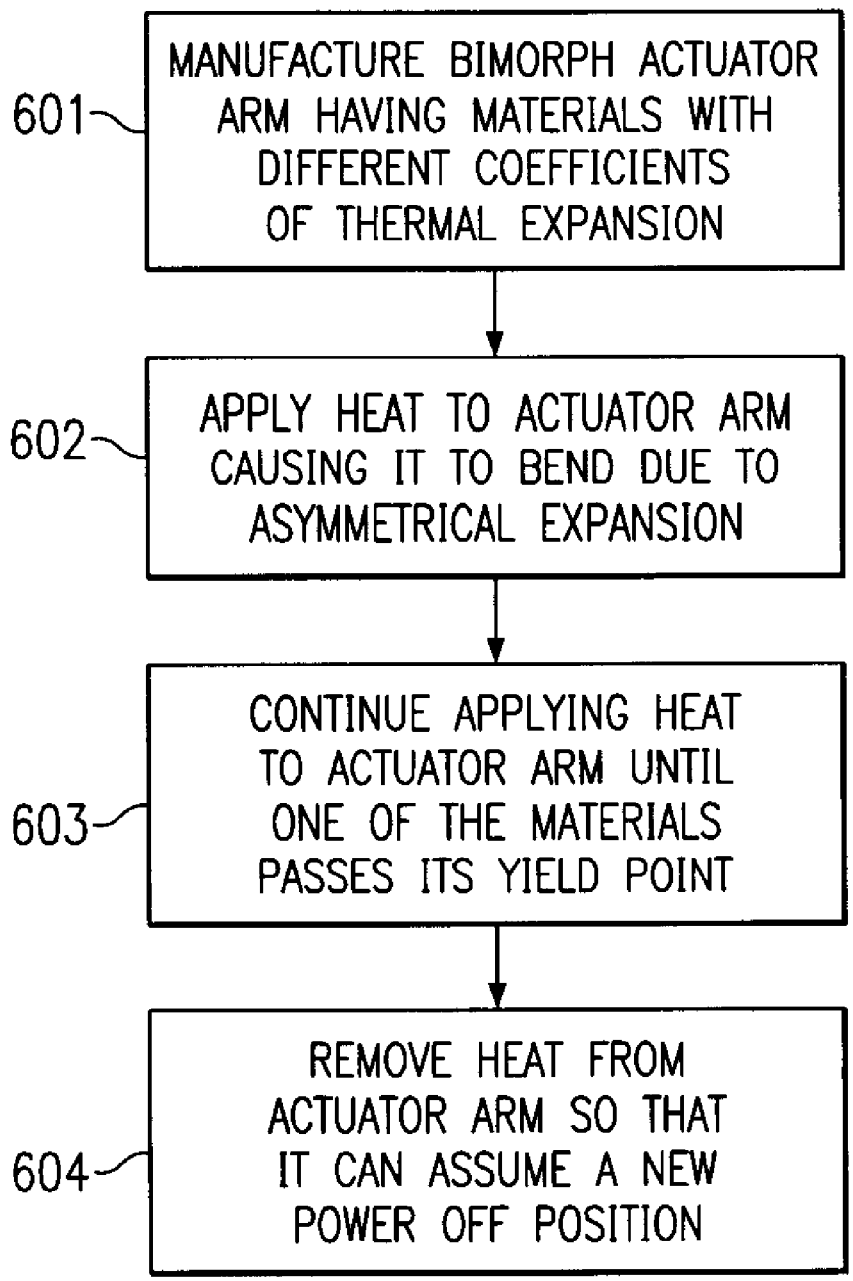
FIG. 6 is a flowchart illustrating a method of plastically deforming a microactuator according to one embodiment of the invention.

FIG. 6 is a flowchart that illustrates the steps involved in modifying a bimorph microactuator. In step 601 a bimorph microactuator is manufactured. Such a microactuator may be, for example, the type illustrated in FIGS. 2A–5C above or any other microactuator in which a section of the microactuator comprises two materials having different coefficients of thermal expansion. The microactuator has an initial position.

In step 602 heat energy, such as an electrical current or a laser, is applied to the bimorph actuator thereby causing the actuator to bend due to the asymmetrical expansion of the bimorph. Heat energy is applied until, in step 603, one of the bimorph materials is pushed beyond a yield point. When the power or heat is removed in step 604, the actuator assumes a new initial position due to residual stress in one of the bimorph materials.

The new position can be adjusted by further stressing the bimorph actuator under power. As the materials are pushed further beyond a yield point, the new initial condition is moved farther from the original position of the microactuator.

The electrothermal plastic deformation techniques disclosed herein may also be used to assemble three dimensional (3D) structures. The present invention can be used to create bi-directional actuators. For example, a structure can be constructed using opposing sets of actuators. The forces due to ambient temperature changes would balance out in the structure, which would provide temperature stability. Additionally, current or heat can be applied to either beam independently to create unidirectional forces that will bend the structure. The use of opposing beams in the microactuator structure also allows for coarse positioning in one direction, with fine adjustment in other direction.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of adjusting the power off positioning of a microactuator having a first power off position, comprising:
   providing a bimorph component of said microactuator, the bimorph comprising at least two materials, wherein the materials have different thermal expansion characteristics;
   heating the bimorph component of the microactuator until one of said materials is forced beyond a yield point; and
   allowing said bimorph component to cool and to assume a second power off position, wherein said microactuator maintains said second power off position due to stress in said bimorph, the stress induced by forcing said material beyond said yield point.

2. The method of claim 1 further comprising:
   attaching a microdevice to said microactuator so that said microdevice moves when power is applied to said microactuator.

3. The method of claim 1 wherein said heating step further comprises:
   heating by passing an electric current through said bimorph component.

4. The method of claim 1 wherein said heating step further comprises:
   using a laser to heat said bimorph component.

5. The method of claim 1 wherein said material forced beyond a yield point is a metal.

6. The method of claim 1 wherein said bimorph is comprised of a metal and polysilicon.

7. The method of claim 1 further comprising:
   moving the microactuator from said second power off position by heating said bimorph.

8. The method of claim 7 wherein said microactuator is moved from said second power off position to said first power off position, and wherein said microactuator must be heated to maintain said first power off position.

9. The method of claim 1 further comprising:
   heating said bimorph a second time until said material passes said yield point a second time; and
   allowing said bimorph component to cool and to assume a third power off position, wherein said microactuator maintains said third power off position due to stress in said bimorph, the stress induced by forcing said material beyond said yield point.

10. The method of claim 9 further comprising:
cycling said bimorph between heating and cooling cycles until said microactuator maintains a desired power off position.

11. A microactuator device comprising:
an actuator arm having at least two materials bonded together to form a bimorph, the materials having different thermal expansion coefficients, the actuator arm having a first end and a second end, the first end attached to a fixed structure and the second end adapted to receive a microcomponent,
wherein one of the at least two materials comprises a residual stress, the residual stress induced by heating the one of the at least two materials until forced beyond a yield point.

12. The microactuator of claim 11 further comprising:
electrical contacts adapted for providing electrothermal heating to said actuator arm.

13. The microactuator of claim 11 wherein said actuator arm is positioned a sufficient distance above a substrate to allow said actuator arm to bend without obstruction under increased temperature conditions.

14. The microactuator of claim 11 wherein one of said materials is a metal.

15. The microactuator of claim 11 wherein one of said materials is polysilicon.

16. The microactuator of claim 11 wherein said microcomponent is an optical receiver.

17. The microactuator of claim 11 wherein said microcomponent is an optical transmitter.

18. The microactuator of claim 11 wherein said microcomponent is a capacitor plate and wherein said actuator arm is positioned to adjust a capacitance.

19. The microactuator of claim 11 wherein said microcomponent is an inductor and wherein said actuator arm is positioned to reduce coupling between the inductor and a substrate.

20. A rotary actuator comprising:
a plurality of cascaded coupled beams, each of said beam having a first arm and a second arm, said plurality of cascaded beams disposed in at least one substantially planar folded serpentine array structure such that a first arm of a first adjacent beam is rigidly joined to a second arm of a second adjacent beam in said serpentine array structure;
wherein said first arm of each beam is operable when activated to deflect in a first direction out of a plane of said substantially planar folded serpentine array structure;
wherein said second arm is operable when activated to remain undeflected;
an initial beam and a final beam in said serpentine array structure each having a terminal end not joined together with an adjacent beam;
said folded serpentine array structure operable when activated to rotate said final terminal end relative to said initial terminal end through an angle of rotation substantially proportional to the sum of the deflections of all of said cascaded coupled beams in said folded serpentine array structure; and
wherein said first arm of at least one of said beams is a bimorph having an initial configuration that is modified to a second configuration when heated beyond a yield point.

21. The rotary actuator of claim 20 wherein said angle of rotation is greater than ninety degrees.

22. The rotary actuator of claim 20 wherein said initial terminal end is attached to a substrate using a technique selected from the group consisting of permanent anchoring and flexible tethering.

23. The rotary actuator of claim 20 wherein said initial terminal end is releasably fastened to a substrate.

24. The rotary actuator of claim 20 further operable to erect said rotary actuator off of a substrate.

25. The rotary actuator of claim 20 further comprising an inductive or capacitive element coupled to said beams.

26. The rotary actuator of claim 20 wherein said final terminal end is coupled to a payload region and wherein said actuator is operable to rotate a payload on said payload region.

27. The rotary actuator of claim 26 wherein said payload is selected from the group consisting of microcomponents, mirrors, and pick-and-place devices.

28. The rotary actuator of claim 20 wherein said lengths of said arms are substantially uniform.

29. The rotary actuator of claim 20 wherein said arms are staggered in length.

30. The rotary actuator of claim 20 wherein said beams are operable to be thermally activated.

31. The rotary actuator of claim 30 wherein said beams are operable to be thermally activated using a method selected from the group consisting of oven heating, laser heating, conductive heating, and resistive joule heating.

32. The rotary actuator of claim 20 wherein said bimorph is comprised of a metal and polysilicon.

33. A method of rotary actuation of an actuator comprising the steps of:
coupling a plurality of beams together in at least one substantially planar folded serpentine array structure such that adjacent beams in said serpentine array structure are substantially parallel in length to one another, each beam comprising a first arm and a second arm, wherein said beams are rigidly joined together such that the first arm of a first adjacent beam is rigidly joined to a second arm of a second adjacent beam in said serpentine array structure, wherein said first arm of at least one of said beams is a bimorph having an initial configuration that is modified to a second configuration when heated beyond a yield point, and
activating said beams such that said first beams deflect in a first direction in a plane substantially perpendicular with said substantially planar folded serpentine array structure and substantially parallel with said lengths of said beams and such that said second beams remain undeflected, such that a final terminal end is rotated relative to an initial terminal end through an angle of rotation substantially proportional to the sum of the deflections of all of said first beams in said folded serpentine array structure.

34. The method of claim 33 wherein said beams are thermally activated.

35. The method of claim 34 wherein said beams are thermally activated by a method selected from the group consisting of oven heating, laser heating, conductive heating, and resistive joule heating.

36. The method of claim 34 wherein said thermal activation causes differential thermal expansion in materials comprising said bimorph.

37. The method of claim 33 wherein said bimorph comprises at least two materials and further comprising:
forcing said bimorph beyond a yield point of one of said materials.

38. The method of claim 33 wherein said activating step causes an angle of rotation greater than ninety degrees.

39. The method of claim 33 wherein said activating step causes said actuator to self erect off of a substrate.

40. The method of claim 33 further comprising:
rotating a payload region attached to said final terminal end.

41. The method of claim 33 wherein said final terminal end is coupled to a payload region operable to carry a payload.

42. The method of claim 33 wherein said beams in said serpentine array structure are connected electrically in series with one another.

43. The method of claim 41 comprising a second said serpentine array structure coupled to said payload region of a first said serpentine array structure.

44. The method of claim 43 wherein said beams in said first and said second said serpentine array structures are electrothermally activated by electric current in two interwoven current paths.

45. The method of claim 44 wherein said electrical currents in said serpentine array structures are independently variable.

46. The method of claim 33 operable to produce rotary motion about a combination of rotational axes.

47. The method of claim 33 further comprising components selected from the group consisting of rotary tweezers, mirrors, optical alignment means, beam steering devices, optical scanning devices, micro-surgical devices, and micro-electromechanical structure manipulation devices.

48. The method of claim 33 further comprising one or more capacitor plates coupled to said beams.

49. The method of claim 33 further comprising one or more inductors coupled to said beams.

* * * * *